United States Patent [19]

Hickernell

[11] Patent Number: 5,949,306

[45] Date of Patent: Sep. 7, 1999

[54] SAW LADDER FILTER WITH SPLIT RESONATORS AND METHOD OF PROVIDING SAME

[75] Inventor: Thomas S. Hickernell, Mesa, Ariz.

[73] Assignee: CTS Corporation, Elkhart, Ind.

[21] Appl. No.: 08/982,536

[22] Filed: Dec. 2, 1997

[51] Int. Cl.⁶ ........................................................ H03H 9/64
[52] U.S. Cl. ............................................ 333/195; 333/193
[58] Field of Search ..................................... 333/193–196; 310/313 R, 313 B, 313 C, 313 D

[56] References Cited

U.S. PATENT DOCUMENTS

| | | | |
|---|---|---|---|
| 5,471,178 | 11/1995 | Hickernell | 310/313 R |
| 5,543,757 | 8/1996 | Kobayashi et al. | 333/195 |
| 5,559,481 | 9/1996 | Satoh et al. | 333/143 |
| 5,844,453 | 12/1998 | Matsui et al. | 310/313 B |

FOREIGN PATENT DOCUMENTS

| | | | |
|---|---|---|---|
| 6-69750 | 3/1994 | Japan | 333/193 |
| 8-204501 | 8/1996 | Japan | 333/193 |

OTHER PUBLICATIONS

"Low Loss Ladder Type SAW Filter In The Range of 300 to 400 MHz", Ueda et al., Published: 1994 IEEE Ultrasonics Symposium Proceedings, pp. 143–146.

"Development of Low–Loss Bandpass Filters Using SAW Resonators For Portable Telephones", Ikata et al., Published: 1992 IEEE Ultrasonics Symposium Proceedings, pp. 111–115.

"L and S Band Low–Loss Filters Using SAW Resonators", Matsuda et al., Published: 1994 IEEE Ultrasonics Symposium Proceedings, pp. 163–167.

*Primary Examiner*—Benny T. Lee
*Assistant Examiner*—Barbara Summons
*Attorney, Agent, or Firm*—Jones, Day, Reavis, & Pogue

[57] ABSTRACT

An acoustic wave ladder filter (55) incorporating split resonators (50) in place of single, small static capacitance resonators in legs of the ladder filter (55). The split resonators (50) have approximately the same frequency but less than twice the static capacitance as the single resonator they replace. The decrease in static capacitance results in a lower capacitance ratio, r. In addition, the Q of the split resonators is higher than the single resonator they replace. Therefore, the average Q/r ratio for the filter (55) increases providing higher performance in terms of insertion loss and ultimate rejection. The basic filter configuration remains relatively unchanged and thus matched to the proper impedances.

21 Claims, 10 Drawing Sheets

SAW LADDER FILTER WITH SPLIT RESONATORS AND METHOD OF PROVIDING SAME

FIELD OF THE INVENTION

This invention relates in general to the field of radio frequency apparatus, in particular to radio frequency filters and more particularly to radio frequency filters employing acoustic waves.

BACKGROUND OF THE INVENTION

There is an ongoing need for component miniaturization in radio wave communication devices. For example, smaller and more efficient components are needed for light-weight, hand-portable cellular telephones, wireless local area networks for linking computer systems within office buildings in a readily reconfigurable fashion, wristwatch- and credit-card-sized paging apparatus and other devices for promoting rapid, efficient and flexible voice and data communication.

Filters are needed for a variety of such communications applications wherein small size, light weight and high performance are simultaneously required. Increasing numbers of products seek to employ fixed spectral resources, often to achieve tasks not previously envisioned. Examples include cellular telephones, inter- and intra-facility computer-computer and/or computer-ancillary equipment linkages as well as a host of other, increasingly complex inter-personal and/or -equipment information sharing requirements. The desire to render increasingly complicated communications nodes portable and even hand-held and/or -portable and/or pocket-sized places extreme demands on filtering technology in the context of increasingly crowded radio frequency resources.

Acoustic wave filters must meet stringent performance requirements including (i) being extremely robust, (ii) being readily mass produced, (iii) and sharply increasing the performance to size ratio achievable in the frequency range extending from a few tens of MegaHertz to about several GigaHertz. However, there is a need for low passband insertion loss simultaneously coupled with demand for high shape factor and wide bandwidth which is not easily met by acoustic wave filters.

One approach to satisfying these needs and demands is to use a substrate with an exceptionally high coupling coefficient. This approach would realize an increased bandwidth and improved shape factor. However, existing substrates are limited in the level of available electromechanical coupling coefficient ($k^2$).

Another approach is to provide two or more such filters on a single substrate. One realization includes a series-shunt arrangement of resonant elements arranged in a ladder structure, i.e., a structure comprising cascaded sections each including a series resonant element followed by a shunt resonant element. Typically, within each section, the anti-resonant frequency of the shunt element is chosen to be the resonant frequency of the accompanying series element, providing pure real input and output impedances. The disadvantage of this approach includes a fixed bandwidth for the coupling coefficient ($k^2$) associated with the chosen substrate material. Furthermore, filter performance is limited by the resonator quality factor, Q, and capacitance ratio, r, defined as the static capacitance divided by the motional capacitance.

Given a constant ratio of Q/r, the tradeoff between insertion loss, bandwidth, and out-of-band rejection is defined. For example, if the rejection is increased, the insertion loss will increase and the bandwidth will decrease. Thus, low-loss and wide-band performance is achieved by increasing Q and/or decreasing r.

What is needed is a ladder filter having resonators with improved Q/r. In addition, it is desirable to maintain filter impedance while providing improved bandwidth and insertion loss in a compact, monolithic form.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference characters refer to similar items throughout the figures, and:

The exemplification set out herein illustrates a preferred embodiment of the invention in one form thereof, and such exemplification is not intended to be construed as limiting in any manner.

DETAILED DESCRIPTION OF THE PREFERRED EMBODIMENT

Figure 1:
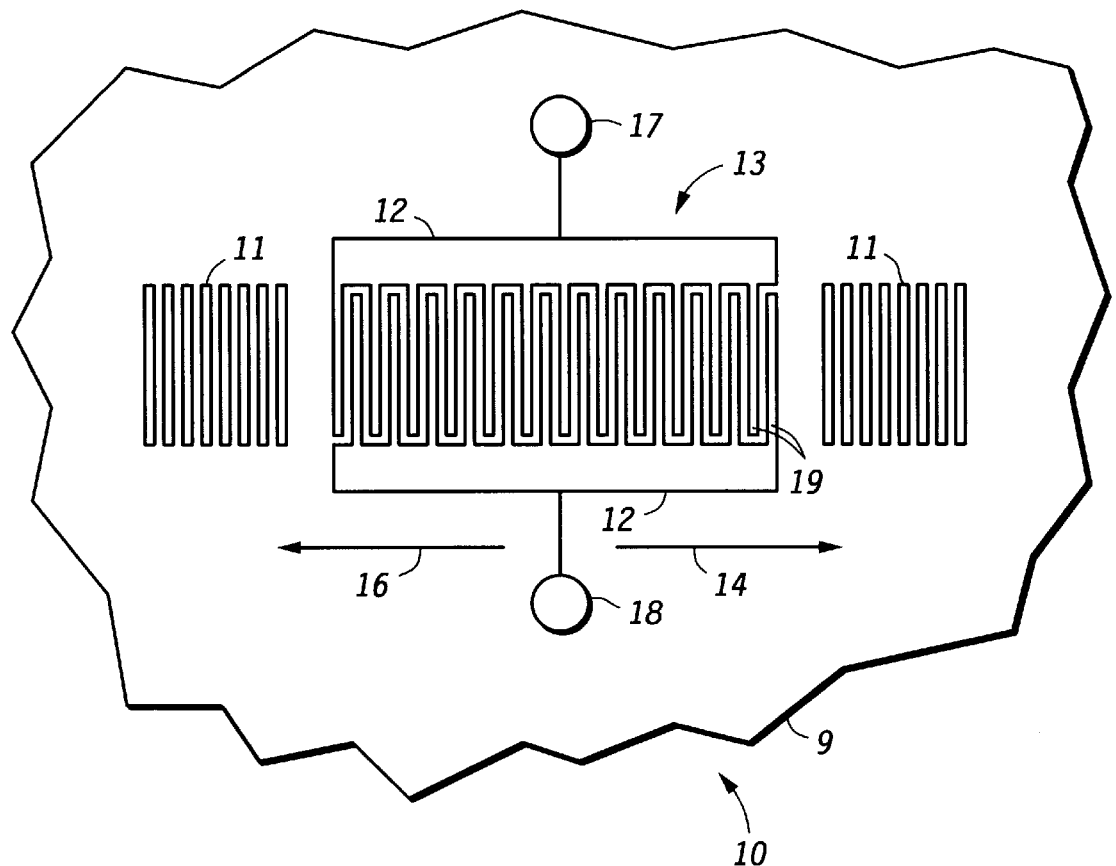
FIG. 1 is a simplified plan view of an acoustic wave resonator including optional reflectors.

FIG. 1 is a simplified plan view of a prior art acoustic wave resonator 10 including a substrate 9 with an acoustic wave transducer 13 disposed thereon. The acoustic wave transducer 13 comprises interdigitated electrodes 19 (also referred to herein an "fingers", "finger electrodes", etc.) coupled alternately to a first terminal 17 or a second terminal 18 via respective bus bars 12. The resonator 10 optionally includes reflectors 11 disposed to either side of the transducer 13 in principal directions 14, 16 of acoustic wave propagation. The reflectors 11 typically comprise metal electrodes analogous to electrodes 19 that are either electrically isolated one from another or coupled to only one of the bus bars 12 within a particular reflector 11 or which may be electrically connected together within a particular reflector 11 but not electrically connected to features outside of that particular reflector 11.

The electrodes 19 typically are periodic and define a particular acoustic wavelength at which the transducer 13 exhibits a characteristic acoustic center frequency together with a center frequency wavelength for the acoustic energy transduced in response to electrical stimulation of an appropriate frequency applied via terminals 17, 18. The electrodes 19 are usefully one-fourth of this center frequency wavelength wide, i.e., measured along directions in accordance with design principles and performance objectives for the resonator 10. The electrodes are disposed on one-half acoustic wavelength centers, usually alternately coupled to their associated bus bars 12, respectively.

Electrical stimulation at an appropriate frequency supplied from electrical terminals 17, 18 to bus bars 12 and thence to interdigitated or interleaved electrodes 19 results in acoustic waves being generated within transducer 13. Similarly, acoustic waves of an appropriate frequency impinging upon electrodes 19 result in electrical signals being manifested at terminals 17, 18. As used herein, the term "acoustic wavelength" is taken to mean an acoustic wavelength at the filter center frequency, i.e., in the nominal center of the filter passband.

The reflectors 11 typically include electrodes or other reflective structures one-fourth of this wavelength wide, i.e., measured along directions 14, 16, because electrodes of this width tend to be reflective. However, other widths providing suitable reflection characteristics may be employed and this width may be chosen to accommodate the reflection characteristics of the materials employed for the resonator 10, including a substrate 9.

The resonator 10 is typically fabricated on a polished surface of a substrate 9 by depositing and patterning a thin metal film, often comprising aluminum, in a thickness ranging from about 50 nm (500 Å) to about 600 nm (6000 Å) thick, by techniques similar to those employed in integrated circuit manufacturing, and directions 14, 16 are carefully aligned with a preferred crystallographic axis providing the desired acoustic transduction, propagation and reflection characteristics.

Figure 2:
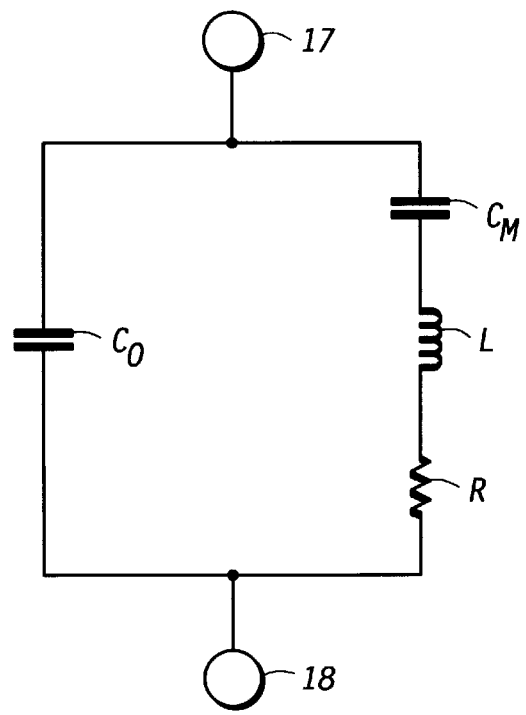
FIG. 2 is a schematic diagram of a simplified equivalent circuit for the resonator of FIG. 1.

FIG. 2 is a schematic diagram of a simplified equivalent circuit for the SAW resonator 10 of FIG. 1 which is conveniently modeled as a series RLC circuit (e.g., a resistor of resistance R having one lead coupled to terminal 18 of FIG. 1, in series with an inductor having inductance L, in turn coupled in series with a capacitor having motional capacitance $C_m$ and having a second lead coupled to terminal 17) bridged by a capacitor having a larger capacitance $C_o$ (i.e., coupled from terminal 17 to terminal 18).

Values for components $C_o$, $C_m$, L, R are found from Eqs. 1–3 (infra), the geometry of transducer 13 and relevant material constants. R may be usefully estimated as zero (i.e., ignored) or may be modeled from empirical data. Values of a few ohms are often encountered in practice. R represents bulk wave radiation, acoustic propagation away from the receiving transducer, metal resistivity, diffraction effects and other losses encountered in acoustic resonant elements. The Q of the resonant circuit is modeled with the resistance R. Static capacitance $C_o$ is found from:

$$C_o = C_e NW \tag{1}$$

where $C_e$ is a material parameter describing capacitance per finger pair per cm (tabulated for many materials in a variety of textbooks), N represents the number of transducer finger pairs (e.g., pairs of electrodes 19 in transducer 13, FIG. 1) and W represents the overlap of electrodes 19 or beamwidth in cm. Motional capacitance $C_m$ is related to static capacitance $C_o$ by:

$$C_m = \frac{8k^2 C_o}{\pi^2} \tag{2}$$

where $k^2$ represents the electromechanical coupling coefficient (tabulated in a variety of textbooks related to piezoelectric materials). Motional inductance L is given by:

$$L = \frac{1}{c_m \omega_r^2} \tag{3}$$

where $\omega_r$ represents the radian transducer resonant frequency. The circuit has a resonant frequency at which the resonant arm of the circuit provides a low impedance path between the terminals 17, 18.

Admittance Y measured between terminals 17, 18 of FIG. 1 is:

$$Y = j\omega C_o + \frac{1}{R + j(\omega L - (1/\omega C_m))} \tag{4}$$

Admittance Y has resonant frequency $\omega_r$, usually close to and slightly lower than the acoustic center frequency (approximately the sound velocity divided by the acoustic wavelength associated with the periodicity of electrodes 19 of the transducer 13):

$$\omega_r = \frac{1}{\sqrt{LC_m}} \tag{5}$$

and antiresonant frequency, $\omega_a$:

$$\omega_a = \omega_r \sqrt{1 + C_m/C_o} \tag{6}$$

or $$\omega_a = \omega_r \sqrt{1 + 8k^2/\pi^2} \tag{7}$$

For a given transducer 13, antiresonant frequency $\omega_a$ is always greater than resonant frequency $\omega_r$ by a ratio determined by electromechanical coupling coefficient $k^2$ (Eq. 7). The antiresonant frequency occurs where the combination of the static capacitance and resonant arm provide a high impedance between the terminals 17, 18. At frequencies that are much higher or lower than the resonant and antiresonant frequencies the electrical response of the circuit appears as if only the static capacitance is present. The separation between the resonant and antiresonant frequencies is determined by the capacitance ratio, r, defined as $$r = C_o/C_m \tag{8}$$

The larger the capacitance ratio, the smaller the separation between resonant and antiresonant frequencies.

Figure 3:
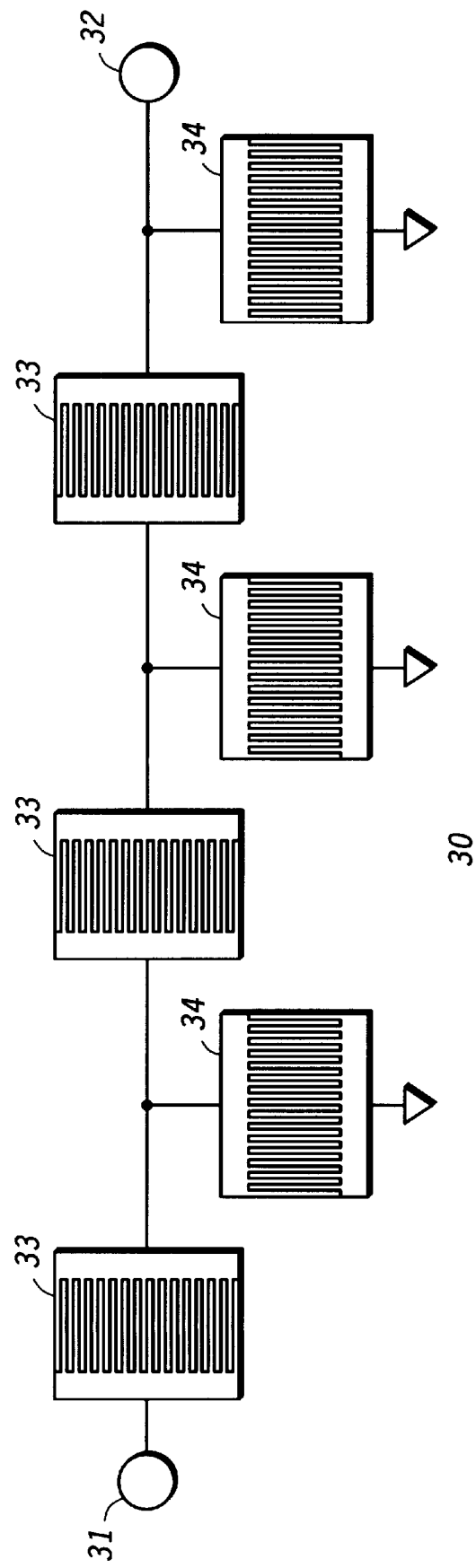
FIG. 3 is a simplified schematic view of a prior art ladder filter incorporating the resonators of FIG. 1.

FIG. 3 is a simplified schematic view of six leg ladder filter 30 having first and second ports 31, 32 in accordance with the present invention, although it is possible to provide a ladder filter having as little as one series leg 33 and one shunt leg 34, each containing one resonator. As the number of legs 33, 34 increase the insertion loss of the filter degrades, but the shape factor improves. Therefore, it is desired to use the minimum number of legs necessary to provide the desired shape factor. The ladder filter 30 is typically specified to have a passband bandwidth about a center frequency, $f_o$, and comprises at least one series leg 33 coupled in series between the first and second ports 31,32 and at least one shunt leg 34 coupled in shunt at a terminal of a series leg 33.

For cellular phone applications, it is preferred to provide six legs to achieve the proper shape factor: three series legs 33 and three shunt legs 34, as shown. In one embodiment, the series legs 33 includes resonators being nominally identical and similarly the shunt legs 34.

The resonators of the series legs 33 can be chosen to have a narrower bandwidth and a corresponding inductive impedance characteristic over at least a portion of the filter passband. In this scenario, the resonators of the shunt legs 34 are chosen to have broader bandwidth and correspondingly capacitive impedance characteristic over the same filter passband portion such that the inductive characteristic of series legs 33 essentially cancel capacitive contributions from the shunt legs 34.

Alternatively, the series legs 33 can be chosen to represent a broader bandwidth and a capacitive impedance characteristic over a portion of the filter passband. The shunt legs 34 are then chosen to provide a narrower passband and an inductive impedance over a portion of the filter passband, with the capacitive impedance component of series legs 33 essentially canceling the inductive contributions from the shunt legs 34 over at least part of the filter passband.

In general, the combined reactive impedances of any of the resonator or legs can contribute in essentially equal parts, or can depend more heavily on one resonator or section than another, or can be essentially derived from only a subset of resonators or legs. Further, when a complex load or source impedance is desired or required, the combined impedances may be chosen to provide a complex conjugate match thereto. In prior art ladder filters each of the series legs 33 and shunt legs 34 consist of a SAW resonator as represented in FIG. 2.

Figure 4:
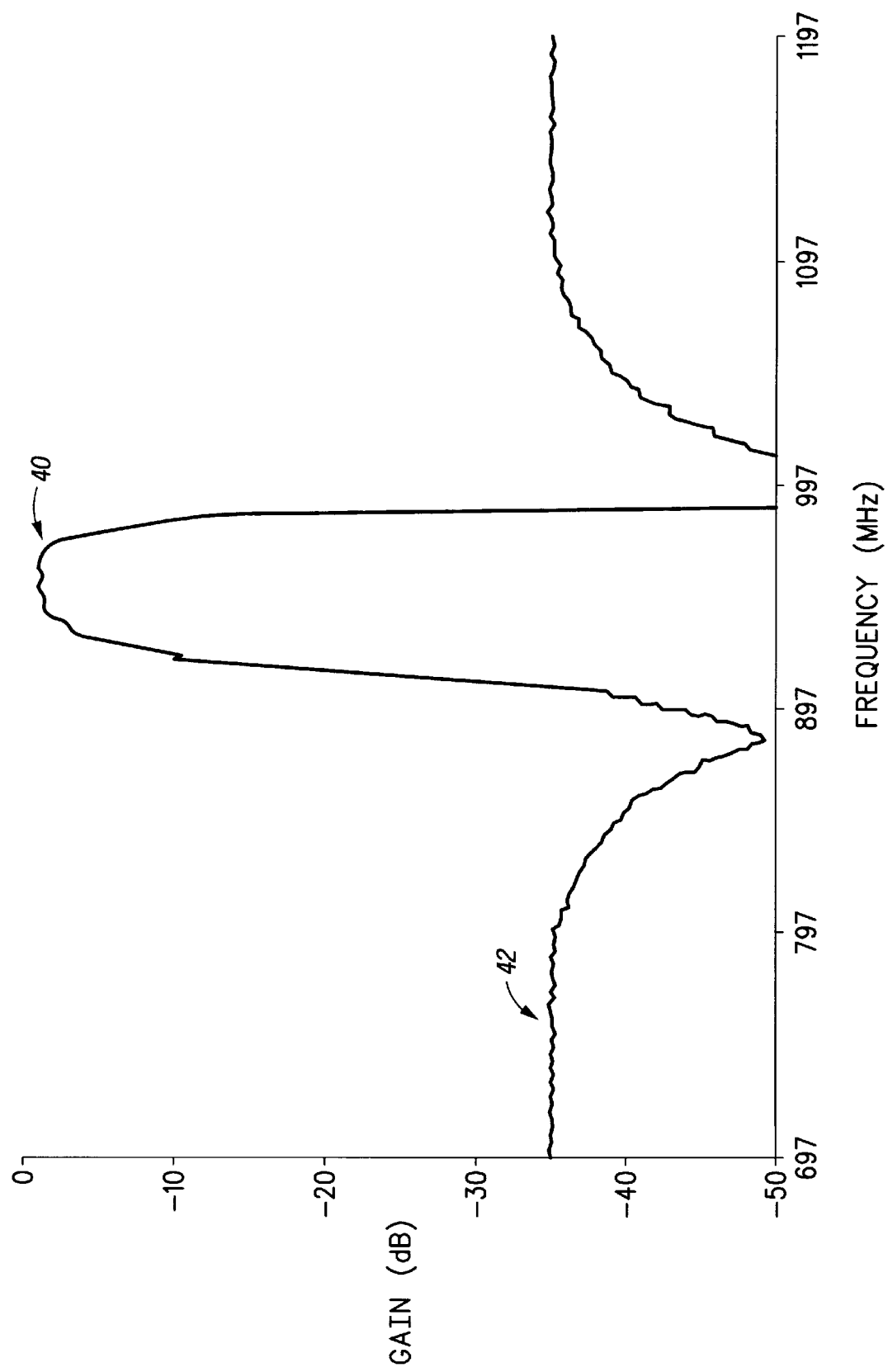
FIG. 4 is a graph of the typical frequency response for the ladder filter of FIG. 3.

Typically, prior art ladder filters employ resonators wherein the resonant frequency of the series resonators are chosen to be equal to the antiresonant frequencies of the shunt resonators. FIG. 4 shows a graph of the frequency response for a typical ladder filter as shown in FIG. 3. The filter demonstrates an ultimate rejection 42 of about 35 dB.

In traditional acoustic filters employing ST-cut quartz resonant elements, electromechanical coupling coefficient $k^2$ is typically much smaller than 0.5%, limiting the fractional bandwidth (bandwidth divided by center frequency) achievable for such filters to very small values. In the present invention, although ST-cut quartz may be utilized, it is preferable to use higher coupling coefficient materials (e.g., $LiNbO_3$, $LiTaO_3$, etc.) which provide a greater spread between resonant and antiresonant frequencies. For example, 64° $LiNbO_3$ provides a coupling coefficient in the range of from 9% to 13% (nominally about 10.5%), 41° $LiNbO_3$ provides coupling coefficients in the range from 15–25% (nominally about 17%) and 36° $LiTaO_3$ provides coupling coefficients in the range from 6.5–8% (nominally about 7.5%). This increased frequency spread in turn allows further design freedom.

Figure 5:
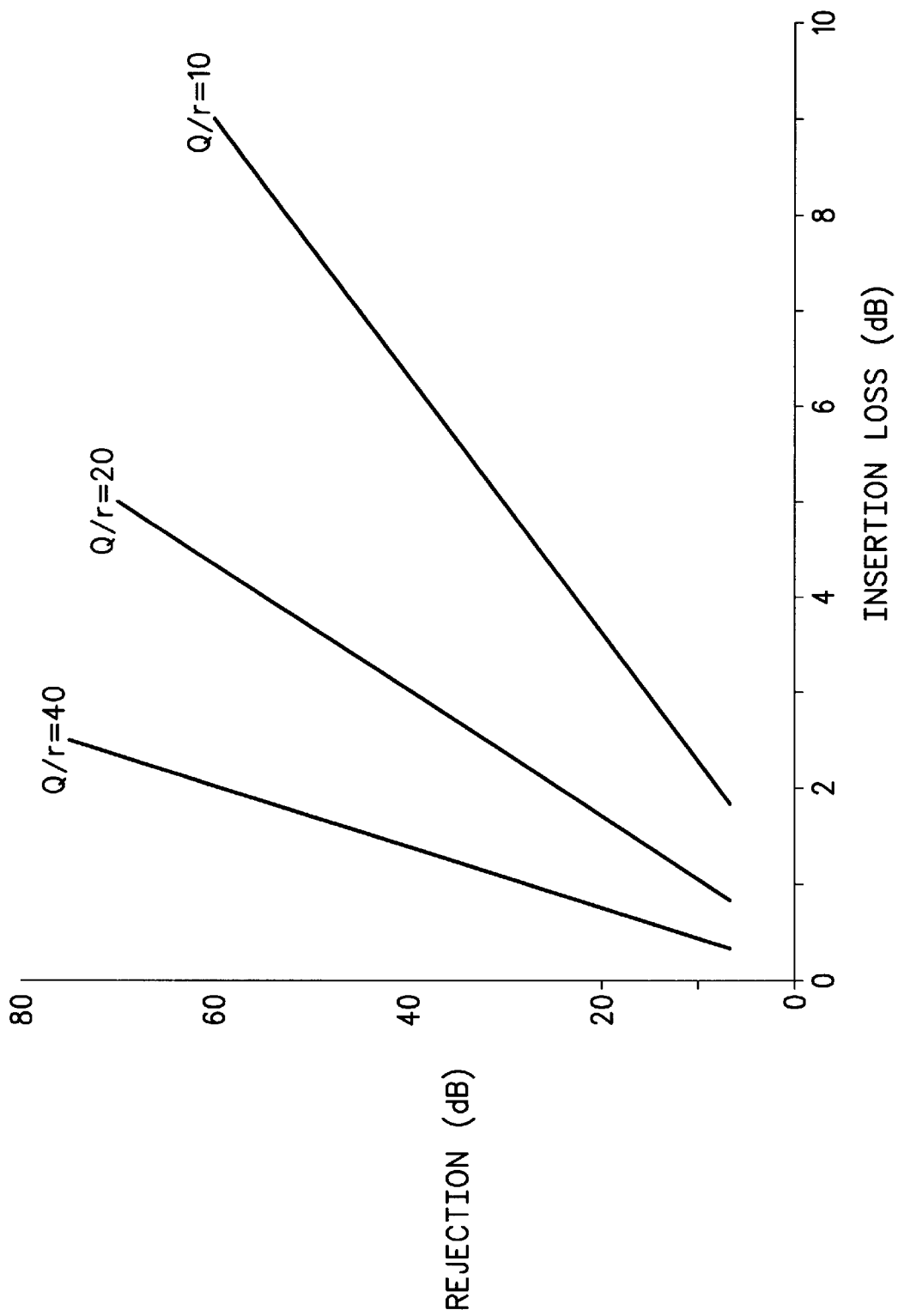
FIG. 5 is a graph of rejection versus insertion loss for various resonator Q/r ratios.

The graph of FIG. 5 demonstrates the tradeoff between ultimate rejection (selectivity) of a filter response and insertion loss for piezoelectric ladder filters (see L. Mang, F. Hickernell, R. Pennel, and T. Hickernell, *"Thin-film resonator ladder filter"*, 1995 Microwave Theory And Techniques Society (MTT-S) Digest, pp. 887–890). Given a Q/r ratio for a resonator in a ladder filter, there is a line that indicates the best rejection that can be expected for a given insertion loss. For example, given a Q/r ratio of 10 in a ladder filter configuration with an insertion loss of 4 dB, the best ultimate rejection that can be achieve is about 20 dB. To achieve a better tradeoff curve (i.e. one with a greater slope) the Q/r ratio must increase.

In general, for small coupling coefficient materials, such as ST-cut quartz, the motional capacitance increases along with the static capacitance so that the capacitance ratio remains constant. However, in the present invention it was found that, for SAW resonators fabricated on high-coupling coefficient materials, the capacitance ratio actually decreases and the Q actually increases with increasing static capacitance.

Figure 6:
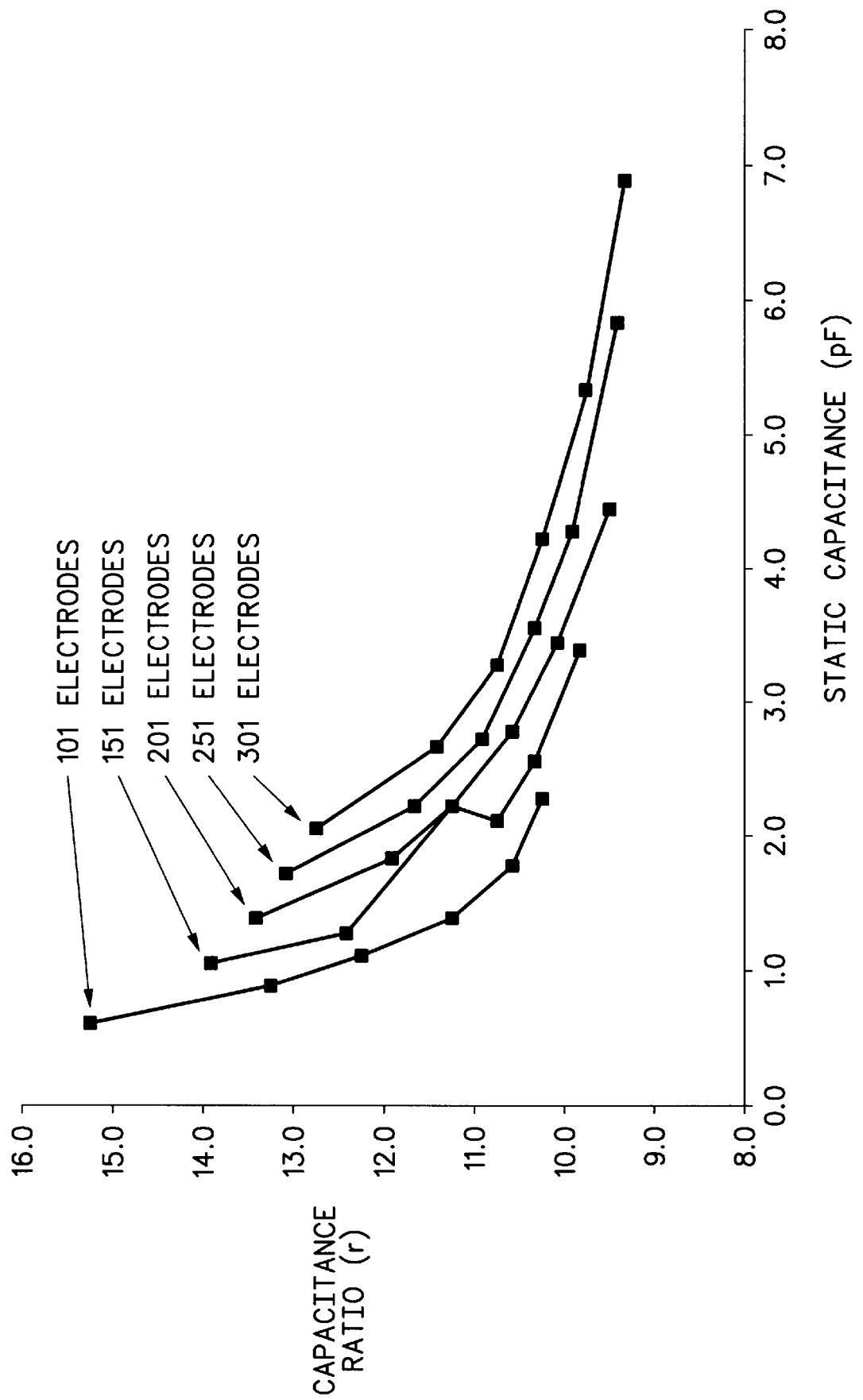
FIG. 6 is a graph of r versus static capacitance for various resonator designs.

FIG. 6 shows the capacitance ratio, r, of several SAW resonators with increasing numbers of electrodes fabricated on 64° Y-cut X-propagating lithium niobate using 136 nm of aluminum for the electrodes. The resonators were measured for static and motional capacitance, and their capacitance ratio was plotted against their static capacitance. In general, as the static capacitance increases the capacitance ratio decreases.

Figure 7:
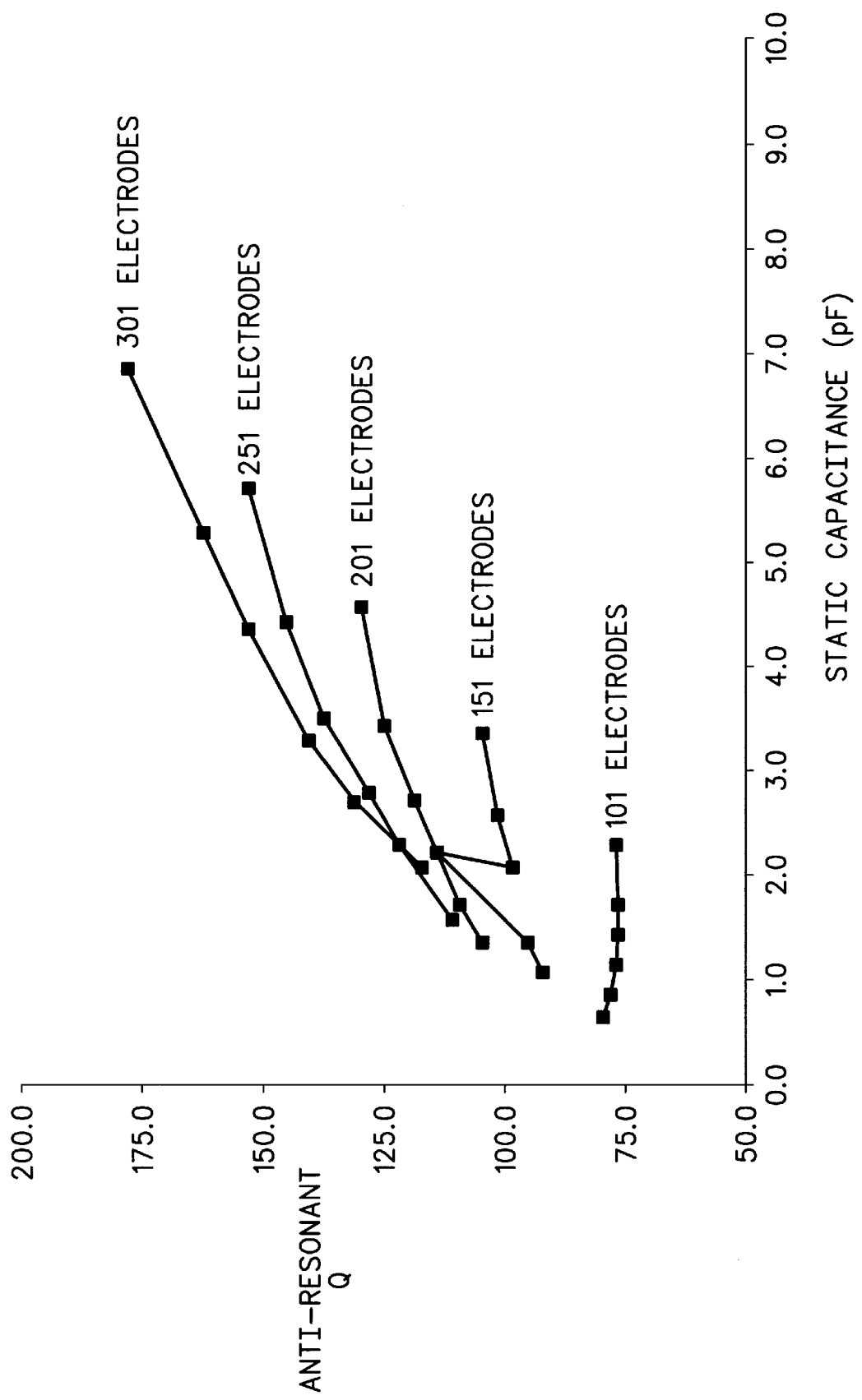
FIG. 7 is a graph of Q versus static capacitance for various resonator designs.

FIG. 7 shows the anti-resonant Q for the same resonators used in the example of FIG. 6. The resonators were measured for Q and static capacitance, and their Q was plotted against their static capacitance. In general, as the static capacitance increases the Q increases.

Figure 8:
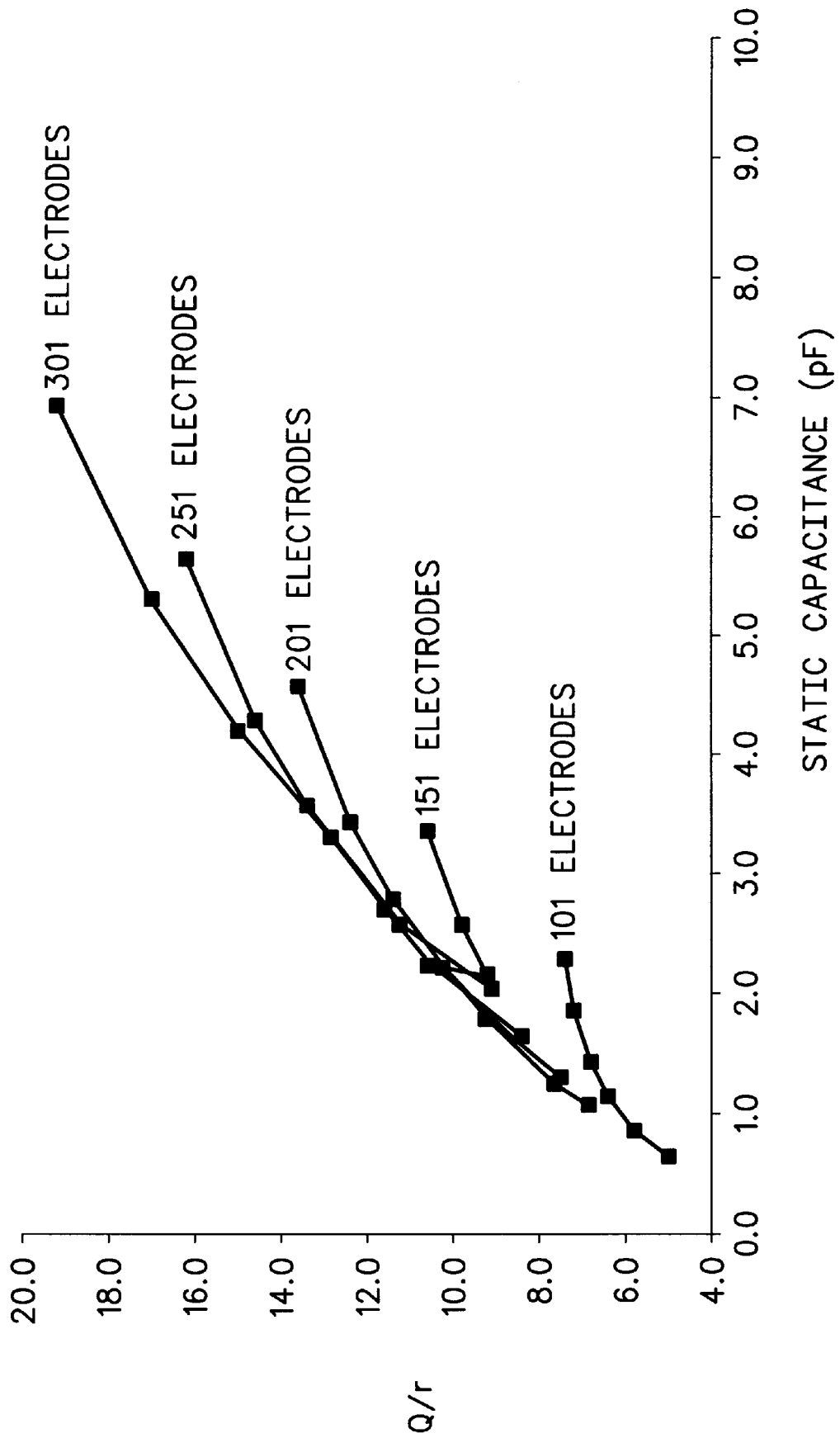
FIG. 8 is a graph of Q/r versus static capacitance for various resonator designs.

FIG. 8 shows the Q/r ratio for the same resonators used in the example of FIGS. 6 and 7. The resonators were measured for static and motional capacitance, and their Q/r ratio was plotted against their static capacitance. In general, as the static capacitance increases, Q gets larger and the capacitance ratio decreases. As a result the Q/r ratio increases. For example, in a resonator with 151 electrodes and a static capacitance of 2.5 pF, the Q/r ratio is about 10. Referring to FIG. 5, such a resonator could only achieve an ultimate rejection of about 40 dB when designed to provide a insertion loss of about 6 dB.

It would therefore seem desirable to design SAW ladder filters with resonator static capacitances that are as large as possible. However, impedance matching constraints limit resonator capacitance to certain ranges that are determined at design. For example, in high ultimate rejection filters the shunt resonators necessarily have high static capacitances, but the series resonators have small static capacitances, on the order of 1 to 2 pF. As can be seen in FIG. 8, these small capacitance values result in Q/r ratios of less than 10.

The present invention increases the static capacitance of resonators having small static capacitances by splitting the resonators in a SAW ladder filter, or any SAW impedance-element filter, into two or more resonators cascaded in series, thereby providing improved Q and reduced capacitance ratio resulting in improved insertion loss at and near the filter center frequency and greater ultimate rejection away from the filter center frequency.

Figure 9:
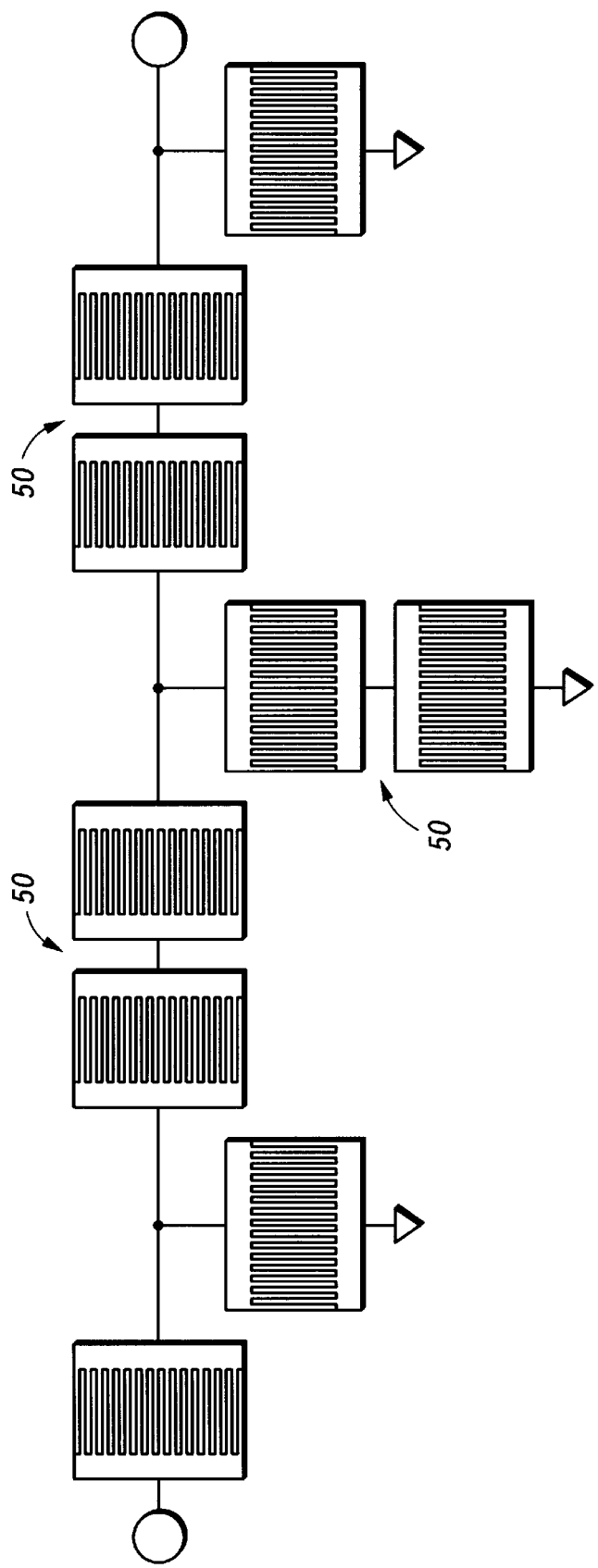
FIG. 9 is a simplified schematic view of a ladder filter incorporating split resonators, in accordance with the present invention.

FIG. 9 shows an example of a ladder filter 55 incorporating split resonators 50 in accordance with the present invention. Preferably, the ladder filter is constructed on 64° Y-cut X-propagating lithium niobate. In a prior art ladder filter (such as FIG. 3 for example), each leg contains one resonator which is designed using techniques well known in the art to have predetermined motional parameters in accordance with desired filter design parameters. In the present invention, as represented in FIG. 9, one or more of the legs provides for the predetermined single resonator to be split into two or more split resonators connected in series. The design of the split resonators is scaled such that the series combination of the split resonators provides the substantially equivalent motional capacitance as the single resonator they are meant to replace. However, one of the novel aspects of the present invention is that it is not necessarily the case that the static capacitance scales equivalently with the motional parameters. Moreover, it was found that increasing the static capacitance provides both increased Q and reduced capacitance ratio which results in improved insertion loss.

Conversely, it should also be recognized and held within the scope of this invention that the split resonators can be combined in parallel to obtain the equivalent motional parameters as a single resonator they are meant to replace. This is less desirable in that decreasing the static capacitance will increase the capacitance ratio and degrade the Q. This would result in poorer performance than if just a single unsplit resonator were used. However, this configuration can be useful in those instances where it is necessary to reduce static capacitance of resonators.

In the present invention, the ladder filter has a first port and a second port and a center frequency. The ladder filter includes at least one series leg coupled in series between the first and second ports. Each series leg provides a predetermined impedance and a predetermined capacitance ratio defined as a static capacitance divided by a motional capacitance. The ladder filter also includes at least one shunt leg coupled in shunt at a terminal of the at least one series leg. Each shunt leg provides a predetermined impedance and a predetermined capacitance ratio defined as a static capacitance divided by a motional capacitance. In at least one of the series or shunt legs, a plurality of series-connected split resonators, but preferably two resonators to save space, are coupled in series, replacing a hypothetical set of resonators numbering less than the plurality of split resonators, typically a single resonator, having a impedance and capacitance ratio substantially equivalent to the predetermined impedance and predetermined capacitance ratio of the associated leg. Each of the split resonators has an associated Q and an associated static capacitance and motional capacitance defining a respective split resonator capacitance ratio as explained previously.

The split resonators provide a total combined impedance that is substantially equivalent to the predetermined impedance of the associated leg or the hypothetical set of resonators they replace. Each split resonator has a capacitance ratio that is less than a capacitance ratio of each of the hypothetical set of resonators numbering less than the plurality of split resonators where the hypothetical set of resonators together exhibit a combined impedance substantially equivalent to the predetermined impedance of the associated leg. This can be realized in a number of ways.

In a first embodiment the split resonators are configured such that a series combination of the split resonators provides a total combined motional capacitance that is substantially equivalent to the predetermined motional capacitance of the associated leg and a total combined static capacitance that is less than the predetermined static capacitance of the associated leg. This results in a reduced capacitance ratio.

In a second embodiment the split resonators are configured such that a series combination of the split resonators provides a total combined static capacitance that is substantially equivalent to the predetermined static capacitance of the associated leg and a total combined motional capacitance that is more than the predetermined motional capacitance of the associated leg. This results in a reduced capacitance ratio.

In a preferred embodiment the split resonators are configured such that a series combination of the split resonators provides a total combined static capacitance that is less than the predetermined static capacitance of the associated leg and a total combined motional capacitance that is more than the predetermined motional capacitance of the associated leg. This also results in a reduced capacitance ratio.

It should also be recognized that it may be possible to configure the split resonators to provide a total combined static capacitance that is greater than the predetermined static capacitance of the associated leg and a total combined motional capacitance that is much greater than the predetermined motional capacitance of the associated leg while still retaining an equivalent impedance. Along the same lines, it may be possible to configure the split resonators to provide a total combined motional capacitance that is less than the predetermined motional capacitance of the associated leg and a total combined static capacitance that is much less than the predetermined static capacitance of the associated leg while still retaining an equivalent impedance.

In particular, the present invention includes the split resonators being configured such that a series combination of the split resonators provides the substantially equivalent predetermined impedance of the associated leg. For example, where two identical split resonators are coupled in series within a leg, each split resonator will have about half the impedance of the predetermined impedance of the associated leg, i.e. the impedance of a single resonator that the split resonators replace. However, it was found that is not a necessary condition that the static or motional capacitance of the split resonators exactly double. Once an original resonator in a leg is replace by two split resonators the configuration of each split resonator must be reoptimized because the change in resonator capacitance ratio of the split resonators generally requires rematching the impedance presented by the split resonators. This reoptimization will require that the motional capacitance and/or the static capacitance of the split resonators be adjusted.

Where the final motional capacitance of the identical split resonators is about twice the predetermined motional capacitance of the associated leg, it was found that the static capacitance will vary from 1.5 to 3.0 times the predetermined static capacitance of the associated leg. On a high coupling coefficient substrate such as 64° Y-cut X-propagating lithium niobate, it was found that the static capacitance of each resonator was less than twice the predetermined static capacitance of the associated leg, i.e. the static capacitance of a single resonator that the split resonators replace, resulting in the capacitance ratio of each split resonator being less than the equivalent predetermined capacitance ratio of the associated leg or the single original resonator.

Where the final static capacitance of the identical split resonators is about twice the predetermined static capacitance of the associated leg, the motional capacitance of each resonator will be more than twice the predetermined motional capacitance of the associated leg, which still results in the capacitance ratio of each split resonator being less than the equivalent predetermined capacitance ratio of the associated leg or the single original resonator.

In both cases, the Q of each split resonator increases as static capacitance increases. This contributes to a higher average Q/r ratio for the filter and thus higher performance in terms of insertion loss and ultimate rejection. Surprisingly, it was found that significant changes in Q/r can be realized in the present invention.

It should be recognized that it is not necessary that the split resonators be identical. However, this is preferred in order to optimize resonator placement and minimize substrate size. Where different split resonators are used, each of the resonators will have an associated static capacitance and motional capacitance defining a respective resonator capacitance ratio. The static capacitance of at least one of the resonators is from 1.5 to 3.0 times the predetermined static capacitance of the associated leg and the motional capacitance of at least one of the resonators is about twice the predetermined motional capacitance of the associated leg.

It should also be recognized that multiple split resonators can be used. In the case of identical split multiple resonators, each split resonator will have an impedance with a value that is about equal to the total number of split resonators multiplied by the predetermined impedance of the associated leg. Unequal resonators can be used equally well as long as the series combination of the split resonators substantially equals the predetermined impedance of the associated leg.

In FIG. 9, split resonators are shown in series and shunt legs for example purposes. The invention will provide improvement with only one set of split resonators in one leg. For filters having a passband about a center frequency, the series resonators are typically much smaller than the shunt resonators, and have correspondingly smaller capacitances. Since the series resonators are smaller, splitting them does not require a great increase in substrate size. Therefore, it is desirable to provide at least two split resonators in at least one, and preferably all, of the series legs of the ladder filter. For filters having a stopband about a center frequency, the shunt resonators become small and the series resonators become large. In this case, it is desirable to provide at least two split resonators in at least one, and preferably all, of the shunt legs of the ladder filter. Moreover, there is a benefit in having all of the legs of the filter include split resonators. However, the tradeoff is that providing split resonators in all the legs of the ladder filter requires a doubling of the substrate size which is often not desirable. The invention can also be applied to lattice filters wherein split resonators are used in any or all of the arms of the lattice filter.

Generally, the present invention provides a method and apparatus for increasing the ratio of Q/r, and subsequently decreasing the insertion loss, in acoustic wave (e.g., SAW, surface skimming bulk wave, leaky wave etc.) filters by increasing the static capacitances of resonators having small static capacitances.

Figure 10:
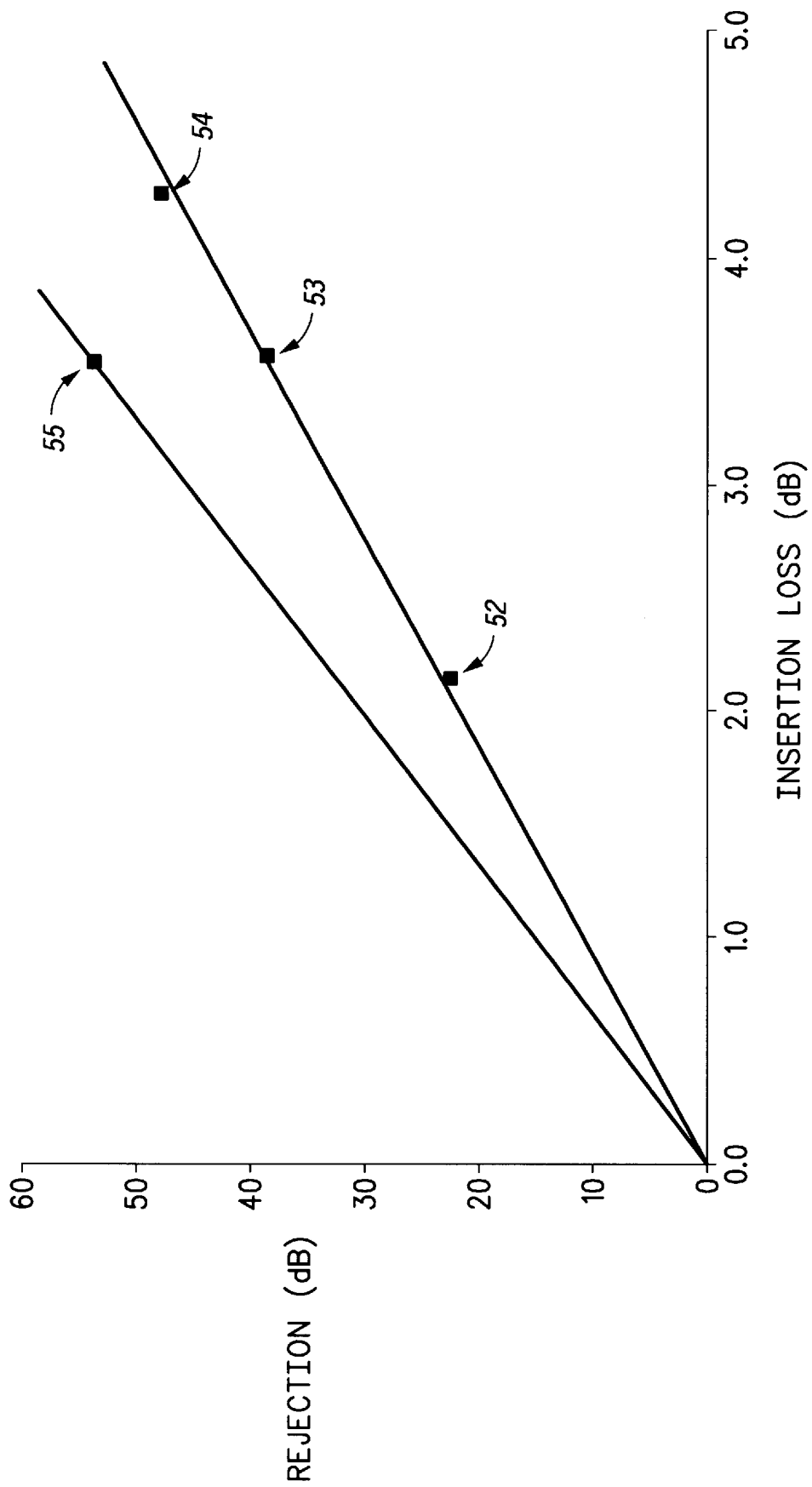
FIG. 10 is a graph of rejection versus insertion loss for prior art filters and a filter built in accordance with the present invention.

FIG. 10 shows the ultimate rejection for several measured prior art SAW ladder filters 52,53,54 fabricated on 64° lithium niobate plotted against the maximum insertion loss across a 3.5% bandwidth. The filters 52,53,54 have configurations similar to that of FIG. 3 and therefore all the filters 52,53,54 fall on the same curve representing similar insertion loss/rejection design tradeoffs. Filter 55 was configured the same as filter 53 with the exception of using the split resonator design of FIG. 9, in accordance with the present invention. The impedances were kept the same. As can be seen the filter 55 falls on a curve which has a better insertion loss/rejection tradeoff than the prior art filter 53.

Advantageously, the filter 55 of the present invention provides at least a 10 dB improvement in ultimate rejection over the prior art filter 53 given the same insertion loss (3.5 dB).

Ladder filters using surface acoustic wave resonators can be readily scaled in frequency by changing the pitch (periodicity) of the resonator transducer fingers (19, FIG. 1) while maintaining the ratios of the resonant frequencies $\omega_r$ obtained from circuit analysis tools or other methods. This allows a designer to re-use a similar design at a slightly different center frequency having similar specifications or permits a quick, two iteration convergence to a desired set of filter characteristics when the relationship between the resonant frequency $\omega_r$ and the transducer acoustic center frequency is not known a priori (e.g., on very high coupling coefficient materials where conventional approximations tend to provide poorer design guidance).

Figure 11:
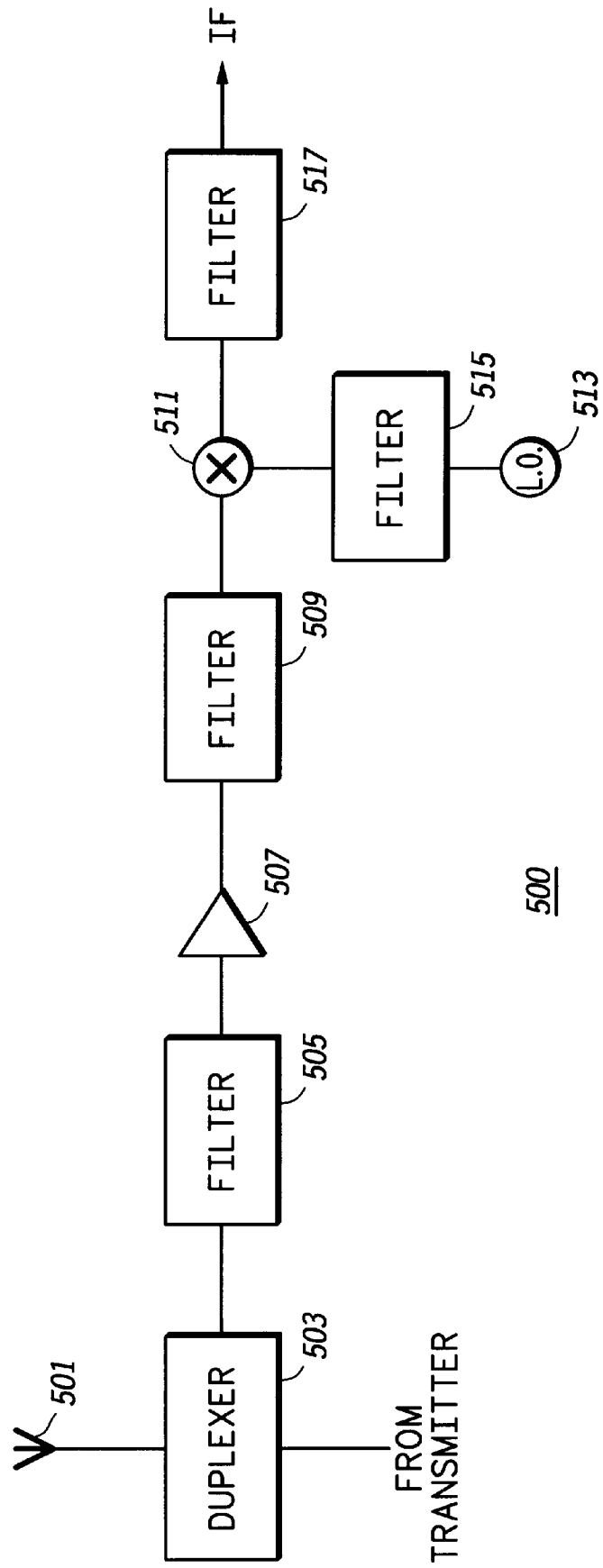
FIG. 11 is a block diagram of a portion of a radio frequency apparatus including a ladder filter, in accordance with the present invention.

FIG. 11 is a block diagram of a portion 500 of a radio frequency receiver or other communication device including acoustic wave filters, in accordance with the present invention. The portion 500 of the radio apparatus includes an antenna 501, by way of example, used to receive and/or transmit signals. Alternatively, the antenna 501 could be replaced by a fiber-optic link, cable or other signal transmissive media. A duplexer 503 is coupled to the antenna 501 and to a transmitter portion (not shown). The duplexer 503 is a special purpose filter which couples signals to a filter 505. Filter 505 can stand alone or be included within the duplexer 503. The filter 505 and duplexer 503 allow a transmitter and receiver operating in different frequency bands to couple to a common port while remaining isolated from each other.

The filter 505 is coupled to an amplifier 507. An output of the amplifier 507 is transmitted to a filter 509 according to the present invention. The filter 509 transmits a signal to a mixer 511. The signal from filter 509 is combined in the mixer 511 with another signal from a local oscillator 513 coupled via a filter 515. An output signal from the mixer 511 is then filtered by a filter 517 to provide an IF output signal. The arrangement of the present invention may be used to provide any or all of the filters 505, 509, 515, 517. An oscillator and filter analogous to the local oscillator 513 and filter 515 may be employed together with a suitable amplifier and modulator to provide the signal "FROM TRANSMITTER" and this filter (known as a "transmit clean-up filter") as well may be provided in accordance with the present invention. One or more of the filters 505, 509, 515, 517 incorporate the ladder filter of the present invention. Preferably, the duplexer 503 incorporates the ladder filter of the present invention on its transmitting or receiving side.

EXAMPLE

The following experimental results serve to give an illustration of the practice of this invention, and are not intended in any way to limit the scope of this invention.

An experiment was conducted to determine the effect of provide split resonators in one leg of a SAW ladder filter, for example, while maintaining the impedance characteristics of the filter. The following is offered as an example of providing split resonators in a series leg of a SAW ladder filter, in accordance with the present invention.

For a 987 MHz SAW ladder filter on 64° lithium niobate, a series leg resonator (shown as 33 in FIG. 3 for example) of the filter was designed, using techniques known in the art, to have a 7-wavelength acoustic aperture and 301 aluminum electrodes of 136 nm thickness. The resonator demonstrated a $C_o$ of 2.62 pF, $C_m$ of 0.228 pF, L of 114 nH, and R of 5.4 ohms. This single resonator exhibited a capacitance ratio, r, of 11.5 and a Q of 130, resulting in a ratio Q/r of 11.3.

In accordance with the present invention, a split resonator pair (shown as 50 in FIG. 9 for example) was designed to replace the above resonator. In order to maintain the impedance characteristics of the pair to correspond to the impedance of the single resonator they replace, each resonator of the pair required its design to be adjusted over what would be predicted in theory. As a result each of the split resonators demonstrated a $C_o$ of 5.24 pF, $C_m$ of 0.536 pF, L of 48.5 nH, and R of 1.8 ohms. Each of the split resonators exhibited a capacitance ratio, r, of 9.7 and a Q of 164, resulting in a ratio Q/r of 16.8.

As a result, the use of split resonators provides a significant improvement in Q/r ratio which allows filter performance having improved insertion loss and ultimate attenuation as previously explained. Thus, an acoustic ladder filter with split resonators has been described which overcomes specific problems and accomplishes certain advantages relative to prior art methods and mechanisms. The improvements over known technology are significant. Further, the improvements are realized for compact and lightweight filters together with improved design flexibility.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the broad scope of the appended claims.

What is claimed is:

1. An acoustic wave ladder filter with a first port and a second port and having a center frequency, the ladder filter comprising:

at least one series leg coupled in series between the first and second ports, each series leg providing a predetermined impedance and a predetermined capacitance ratio defined as a static capacitance divided by a motional capacitance;

at least one shunt leg coupled in shunt at a terminal of the at least one series leg, each shunt leg providing a predetermined impedance and a predetermined capacitance ratio defined as a static capacitance divided by a motional capacitance; and at least one of the legs including a plurality of split resonators coupled in series and configured such that a series combination of split resonators provide a total combined impedance that is substantially equivalent to the predetermined impedance of the associated leg, each of the split resonators having an associated static capacitance and motional capacitance defining a respective split resonator capacitance ratio, the split resonator capacitance ratio of at least one of the split resonators being less than the predetermined capacitance ratio of the associated leg.

2. The acoustic wave ladder filter of claim 1, wherein each respective split resonator capacitance ratio is less than a capacitance ratio of a set of resonators numbering less than the plurality of split resonators and having a total combined impedance that is substantially equivalent to the predetermined impedance of the associated leg.

3. The acoustic wave ladder filter of claim 2, wherein the split resonators are configured such that a series combination of the split resonators provides a total combined motional capacitance that is substantially equivalent to the predetermined motional capacitance of the associated leg and a total combined static capacitance that is less than the predetermined static capacitance of the associated leg.

4. The acoustic wave ladder filter of claim 2, wherein the split resonators are configured such that a series combination of the split resonators provides a total combined static capacitance that is substantially equivalent to the predetermined static capacitance of the associated leg and a total combined motional capacitance that is more than the predetermined motional capacitance of the associated leg.

5. The acoustic wave ladder filter of claim 2, wherein the split resonators are configured such that a series combination of the split resonators provides a total combined static capacitance that is less than the predetermined static capacitance of the associated leg and a total combined motional capacitance that is more than the predetermined motional capacitance of the associated leg.

6. The acoustic wave ladder filter of claim 1, wherein the ladder filter has a passband about the center frequency, and wherein the split resonators are included within a series leg of the ladder filter.

7. The acoustic wave ladder filter of claim 1, wherein the ladder filter has a stopband about the center frequency, and wherein the split resonators are included within a shunt leg of the ladder filter.

8. The acoustic wave ladder filter of claim 1, wherein the split resonators are identical and the split resonator capacitance ratio of each split resonator is less than a capacitance ratio of a resonator having an impedance substantially equivalent to the impedance of the associated leg.

9. A radio communication device having a receiver and including an acoustic wave ladder filter with a first port and a second port and having a center frequency, the ladder filter comprising:

at least one series leg coupled in series between the first and second ports, each series leg providing a predetermined impedance and a predetermined capacitance ratio defined as a static capacitance divided by a motional capacitance;

at least one shunt leg coupled in shunt at a terminal of the at least one series leg, each shunt leg providing a predetermined impedance and a predetermined capacitance ratio defined as a static capacitance divided by a motional capacitance; and at least one of the legs including a plurality of split resonators coupled in series and configured such that a series combination of split resonators provide a total combined impedance that is substantially equivalent to the predetermined impedance of the associated leg, each of the split resonators having an associated static capacitance and motional capacitance defining a respective split resonator capacitance ratio, the split resonator capacitance ratio of at least one of the split resonators being less than the predetermined capacitance ratio of the associated leg.

10. An acoustic wave ladder filter with a first port and a second port and having a center frequency, the ladder filter comprising:

at least one series leg coupled in series between the first and second ports, each series leg providing a predetermined impedance and a predetermined capacitance ratio defined as a static capacitance divided by a motional capacitance;

at least one shunt leg coupled in shunt at a terminal of the at least one series leg, each shunt leg providing a predetermined impedance and a predetermined capacitance ratio defined as a static capacitance divided by a motional capacitance; and at least one of the legs including two identical split resonators coupled in series, each of the split resonators having an associated Q and an associated split resonator capacitance ratio defined as a split resonator static capacitance divided by a split resonator motional capacitance, a ratio of the split resonator Q to the split resonator capacitance ratio being greater than a ratio of Q to a capacitance ratio of an associated single resonator having an impedance that is substantially equivalent to the predetermined impedance of the associated leg.

11. The acoustic wave ladder filter of claim 10, wherein the Q of each split resonator is greater than the Q of the single resonator having an impedance substantially equivalent to the predetermined impedance of the associated leg, each split resonator motional capacitance is about twice the motional capacitance of the single resonator having an impedance substantially equivalent to the predetermined impedance of the associated leg, and each split resonator static capacitance is less than twice the static capacitance of the single resonator having an impedance substantially equivalent to the predetermined impedance of the associated leg.

12. The acoustic wave ladder filter of claim 10, wherein the Q of each split resonator is greater than the Q of the single resonator having an impedance substantially equivalent to the predetermined impedance of the associated leg, each split resonator motional capacitance is more than twice the motional capacitance of the single resonator having an impedance substantially equivalent to the predetermined impedance of the associated leg, and each split resonator static capacitance is about twice the static capacitance of the single resonator having an impedance substantially equivalent to the predetermined impedance of the associated leg.

13. The acoustic wave ladder filter of claim 10, wherein the Q of each split resonator is greater than the Q of the single resonator having an impedance substantially equivalent to the predetermined impedance of the associated leg, each split resonator motional capacitance is more than twice the motional capacitance of the single resonator having an impedance substantially equivalent to the predetermined impedance of the associated leg, and each split resonator static capacitance is less than twice the static capacitance of the single resonator having an impedance substantially equivalent to the predetermined impedance of the associated leg.

14. The acoustic wave ladder filter of claim 10, wherein the ladder filter has a passband about the center frequency, and wherein the two split resonators are included within a series leg of the ladder filter.

15. The acoustic wave ladder filter of claim 10, wherein the ladder filter has a stopband about the center frequency, and wherein the two split resonators are included within a shunt leg of the ladder filter.

16. A method for improving the insertion loss and ultimate rejection of an acoustic wave ladder filter having a center frequency, a first port and a second port, said method comprising the steps of:

providing a high coupling coefficient piezoelectric substrate;

disposing series-connected and shunt-connected legs each including a single resonator having an associated predetermined impedance and a predetermined capacitance ratio defined as a static capacitance divided by a motional capacitance in a ladder network configuration onto the substrate; and splitting at least one of the single resonators into a plurality of series-connected split resonators having a combined impedance about equal to the predetermined impedance of the associated single resonator with each of the split resonators having a split resonator capacitance ratio less than the predetermined capacitance ratio of the associated single resonator.

17. The method of claim 16, wherein the splitting step includes the split resonators being within at least one series leg of the ladder filter such that a passband response about the center frequency of the ladder filter is improved.

18. The method of claim 16, wherein the splitting step includes the split resonators being within at least one shunt leg of the ladder filter such that a stopband response about the center frequency of the ladder filter is improved.

19. The method of claim 16, wherein the splitting step includes the series-connected split resonators being configured to provide a total combined motional capacitance that is substantially equivalent to the motional capacitance of the associated single resonator and a total combined static capacitance that is less than the static capacitance of the associated single resonator.

20. The method of claim 16, wherein the splitting step includes the series-connected split resonators being configured to provide a total combined motional capacitance that is greater than the motional capacitance of the associated single resonator and a total combined static capacitance that is substantially equivalent to the static capacitance of the associated single resonator.

21. The method of claim 16, wherein the splitting step includes the series-connected split resonators being configured to provide a total combined motional capacitance that is greater than the motional capacitance of the associated single resonator and a total combined static capacitance that is less than the static capacitance of the associated single resonator.

* * * * *